United States Patent [19]

Dworkin et al.

[11] Patent Number: 5,438,263

[45] Date of Patent: * Aug. 1, 1995

[54] METHOD OF SELECTABLE RESOLUTION MAGNETIC RESONANCE IMAGING

[75] Inventors: Jay S. Dworkin, Commack; Robert B. Wolf, Medford, both of N.Y.

[73] Assignee: Fonar Corporation, Melville, N.Y.

[*] Notice: The portion of the term of this patent subsequent to Dec. 1, 2009 has been disclaimed.

[21] Appl. No.: 669,941

[22] Filed: Mar. 15, 1991

[51] Int. Cl.⁶ .............................................. G01R 33/20
[52] U.S. Cl. ................................................... 324/309
[58] Field of Search ............... 324/300, 307, 309, 310, 324/311, 312, 313, 318, 322; 128/653 SC, 653 A

[56] References Cited

U.S. PATENT DOCUMENTS

| | | | |
|---|---|---|---|
| 4,527,124 | 7/1985 | Van Uijen | 324/309 |
| 4,585,992 | 4/1986 | Maudsley et al. | 324/309 |
| 4,654,595 | 3/1987 | Sepponen | 324/309 |
| 4,691,162 | 9/1987 | Van Uijen | 324/309 |
| 4,703,270 | 10/1987 | Hall | 324/309 |
| 4,740,748 | 4/1988 | Rzedzian | 324/309 |
| 4,748,411 | 5/1988 | Holland | 324/309 |
| 4,818,942 | 4/1989 | Rzedzian | 324/312 |
| 4,940,941 | 7/1990 | Rzedzian | 324/312 |
| 5,036,281 | 7/1991 | Li | 324/309 |

*Primary Examiner*—Michael J. Tokar
*Attorney, Agent, or Firm*—Emmanuel J. Lobato

[57] ABSTRACT

Multi-slice selectable resolution NMR data acquisition in which multiple slice regions in an object are defined, and the slice regions are excited to emit NMR signals. The NMR signals are spatially encoded, and at least two selected slice regions are excited to emit NMR signals encoded with different spatial resolutions.

16 Claims, 4 Drawing Sheets

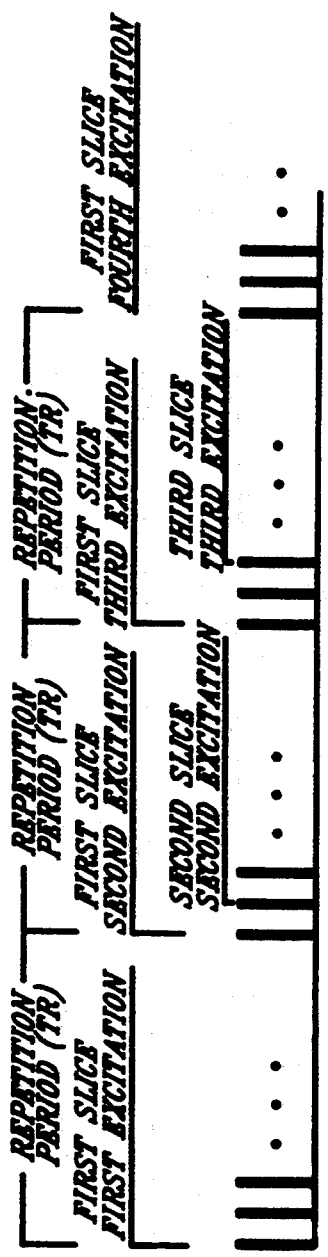
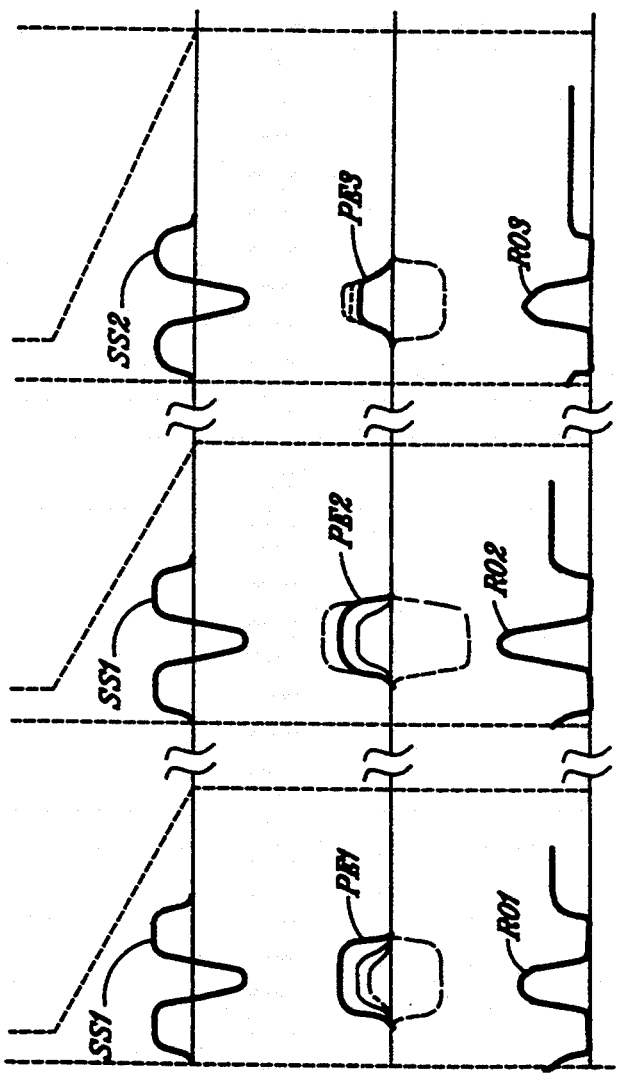

METHOD OF SELECTABLE RESOLUTION MAGNETIC RESONANCE IMAGING

BACKGROUND OF THE INVENTION

The present invention relates to a method for obtaining nuclear magnetic resonance data for imaging. More particularly, the invention relates to a multi-slice selectable resolution imaging method.

Magnetic resonance imaging (MRI) techniques have become well developed and are widely used for medical diagnostic purposes. The utility of MRI techniques has been enhanced in recent years by methods and systems which give the radiologist improved control over the placement of imaged sections or slices. Such an improvement is disclosed in commonly assigned U.S. Pat. No. 4,871,966 for Apparatus and Methods for Multiple Angle Oblique Magnetic Resonance Imaging. The patent claims a system which allows MRI data to be collected during the course of a single scan for multiple slices having different selectable orientations which are oblique to the principal symmetry planes of a coordinate system.

The prior art system, however, does not give control over the resolution of individual slices in a multi-slice scan. As used herein, the term "spatial resolution" is defined as the in-slice resolution of image data obtained within the respective slices, and the thicknesses of the slices. The fixed resolution of the prior art systems places limitations on the data that can be obtained by MRI. For example, data to be obtained for different spinal column discs can not be obtained with different slice thicknesses during the same scan. Likewise, head scans must be performed with uniform slice resolution. Consequently, the radiologist is required to choose a compromise slice thickness and in-slice resolution, or to perform more than one scan in order to obtain the desired MRI data. Neither approach is wholly satisfactory.

SUMMARY OF THE INVENTION

It is an object of the invention to provide a method for obtaining MRI data of multiple image sections or slices, with different resolutions, during a single scan of an object.

Another object of the invention is to provide a method for obtaining MRI data of multiple slices, with different in-slice resolutions, during a single scan.

Another object of the invention is to provide a method for obtaining MRI data of multiple slices, with different thickness resolutions, during a single scan.

Another object of the invention is to provide a method for obtaining MRI data of multiple slices with different resolutions, without reducing the number of slices or the orientations of the slices which could otherwise be realized.

Nuclear magnetic resonance data for imaging is obtained from multiple slice regions within an object with different spatial resolutions for different slices. A plurality of slice regions are defined in the object. The slice regions are excited to emit NMR signals encoded according to the distribution of nuclei within the respective slice regions, and at least two selected slice regions are excited to emit NMR signals encoded with different spatial resolutions. The emitted NMR signals are received, and the slice excitations are repeated without interruption until NMR signals from each slice region sufficient to obtain the desired resolution have been received.

The method can be carried out with the spatial encoding for the slice regions differing in thickness resolution, in-slice resolution or both. The received NMR signals are used to form slice images, each with its own selected resolution. The method imposes no limitations on the number of slices or the slice orientations.

BRIEF DESCRIPTION OF THE DRAWING

FIGS. 2a, 2b, 2c and 2d are waveform diagrams of generic waveforms as they are used to carry out a preferred embodiment of the method according to the invention.

DETAILED DESCRIPTION OF THE PREFERRED EMBODIMENTS

In its preferred embodiment the present invention is implemented in an MRI imaging technique known as two-dimensional Fourier transform (2-D FT) imaging. The 2-D FT imaging technique is well known and a detailed description of it can be found in the literature of the field. See, for example, the text: Nuclear Magnetic Resonance Imaging in Medicine, Leon Kaufman, et. al, Ed, published 1981 by Igaku-Shoian Ltd. The invention is not limited to 2-D FT imaging; however, and it may be applied to other MRI techniques.

Figure 1:
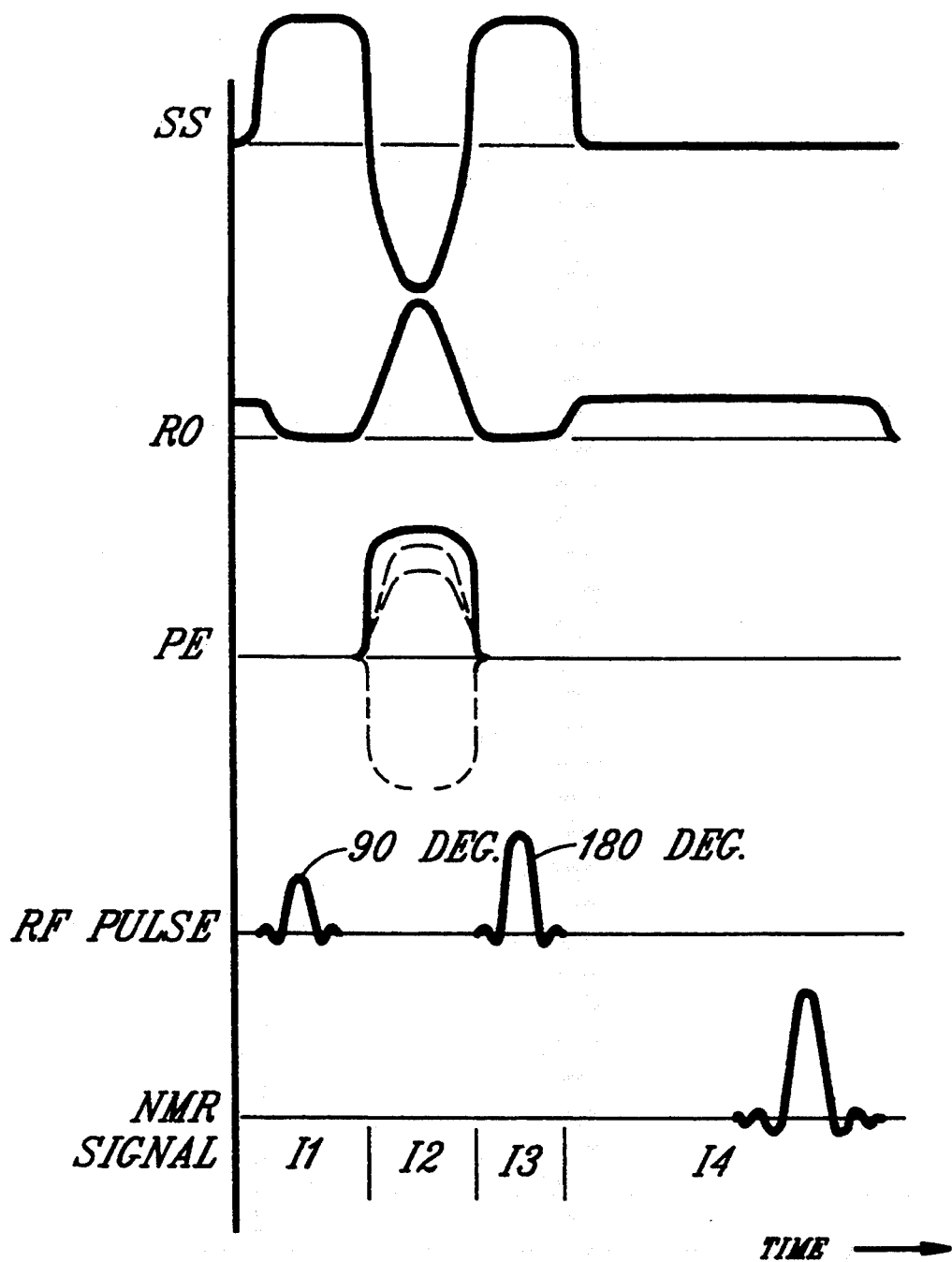
FIG. 1 is a waveform diagram of generic waveforms used in carrying out known NMR techniques.

FIG. 1 illustrates magnetic field gradient waveforms for carrying out 2-D FT imaging. During interval I1 a slice select magnetic field gradient SS is developed. The gradient SS is effective to define planar slice regions within the object that each contains nuclei which exhibit a respective distinct NMR frequency corresponding to the slice region. A 90° RF pulse is applied to irradiate the object with radio frequency energy during time interval I1 to resonate nuclei of the object within a selected first slice region.

During the time interval I2 the polarity of the slice select magnetic field gradient SS is reversed, and a phase encoding magnetic field gradient PE is developed. The magnetic field gradient PE spatially encodes the NMR signals emitted from the first slice region with a first spatial resolution. During the time interval I2 a readout magnetic field gradient RO is also developed.

In the subsequent time interval I3 the slice select magnetic field gradient SS is again developed and a second RF pulse, the 180° rephasing pulse, irradiates the object being imaged. Finally, in the fourth time interval readout magnetic field gradient RO is developed and an signal is received.

The pulse sequence just described is known. Moreover, variations of it are known. For example, the 180 degree rephasing pulse is used to employ the spin-echo technique and can be omitted as can the readout gradient in interval I2 and the slice select gradient in interval I3. The collection of gradients and the RF pulses, of whatever form and variation that is utilized, is referred as a slice repetition sequence.

The phase encoding gradient waveform PE is illustrated as a family of waveforms. In any particular repetition sequence a particular waveform of the phase encoding waveform family will be used. For a particular slice the repetition sequence will be repeated with each instance of the repetition sequence having a different one of the phase encoding waveforms.

The illustrated magnetic field gradient waveforms utilized in the preferred embodiment of the present invention are derived from a generic waveform. The use of generic waveforms is described in detail in previously mentioned U.S. Pat. No. 4,871,966. It is sufficient to say that a particular gradient waveform is derived by appropriately shifting and scaling the generic waveform so as to obtain the desired waveform of a gradient to be applied to the object being imaged.

There are two measures of the resolution of a slice. One is in the thickness direction of the slice, and the other is along the extent of the slice. The former is the thickness resolution (or simply thickness) and the latter is the in-slice resolution. As used herein, the term "spatial resolution" (or simply resolution) of a slice encompasses both the in-slice resolution and the thickness resolution. The MRI technique discussed in connection with FIG. 1 has no provision for setting or selecting different spatial resolutions at different positions within the same scan. During the course of a scan the slice repetition sequence is repeated with changes occurring in the RF pulse frequency for selecting the particular slice. The phase encoding gradient steps through the same predetermined sequence for each slice, and the readout gradient is the same for each slice to spatially encode the slices with the same resolution. Consequently, the image resolution is fixed for the entire scan.

FIGS. 2a, 2b, 2c and 2d illustrate the waveforms and the relative timing of the gradients used to carry out the method according to the present invention. In the preferred embodiment two-dimensional Fourier transform imaging with spin echo is used, but the method according the invention is applicable to other imaging techniques.

FIG. 2a is a timing diagram in which each vertical marker represents the occurrence of a repetition sequence. In the preferred embodiment each vertical marker indicates a slice excitation by a 90° pulse. The repetition sequence markers are labeled according to which slice in the sequence of excitations, and which instance of excitation, the marker corresponds. The time required to excite all of the slices once is referred to as the repetition period (TR). A scan is the totality of all the instances of the slice repetition sequences, and the total scan time equals the sum of the repetition periods, provided there is no in interruption in the scan.

FIG. 2b illustrates the gradient waveforms of the repetition sequence for the first excitation of the first slice to be excited. The time axis in FIG. 2b is expanded to show the waveforms of the gradients which occur between the first excitation of the first and second slices. In he preferred embodiment the repetition sequence has the same components as that shown in FIG. 1. The slice select gradient SS1 corresponds to some particular slice width. The family of phase encoding gradients PE1 and the readout gradient RO1 will be effective to encode the nuclear spins within the first slice with some corresponding in-slice spatial resolution.

Upon excitation of the second slice a new repetition sequence shown in FIG. 2c will occur. In this repetition sequence the slice select gradient SS1 is the same as in FIG. 2b so that the slice thickness will be the same as he thickness of the first excited slice. The family of phase encoding gradient waveforms PE2 is different from the sequence PE1 shown in FIG. 2b. Readout gradient RO2 is also different from RO1. Sequence PE2 is selected to encode the NMR signals from the second slice with a different in-slice spatial resolution than the first slice, and consequently, MRI data from the second slice will have a different in-slice resolution.

FIG. 2d illustrates the repetition sequence for the third slice which is excited. In this repetition sequence a second slice select gradient SS2 is used, together with a third sequence PE3 of phase encoding gradient waveforms and a third readout gradient RO3. Consequently, the third slice which is excited will have a different thickness from the first and second slices, and the in-slice resolution of the MRI data will be different from the first and second slices.

Thus according to the present invention, after NMR signals are received from the first slice, the object to be imaged is irradiated with radio frequency energy to resonate nuclei of the object within a selected second slice region. Magnetic field gradients are established to orient the resonant nuclear spins and spatially encode the NMR signals emitted from the second slice region with a spatial resolution different than that of the firs slice region, and NMR signals from the nuclei within the second slice region are received. This occurs within the same scan so that MRI data of different resolutions for different slices is obtained in the course of a single continuous scan.

The invention is applied in practice in the following manner. The object from which NMR data is to be obtained is scanned and an initial scout image is displayed. The scout image facilitates precise positioning and defining of the slice regions for which data is to be obtained. A plurality of slice regions of the object are defined with respect to the scout image, for example by the placement of slice markers on the scout image. For each marked slice, the spatial resolution of the slice NMR data to be obtained is selected. At least two slices have different spatial resolutions which differ in thickness resolution, in-slice resolution, or both. The NNR data from the selected slices is obtained during the course of a single scan. The collected NNR data can then be used to form images of the slice regions.

Figure 3:
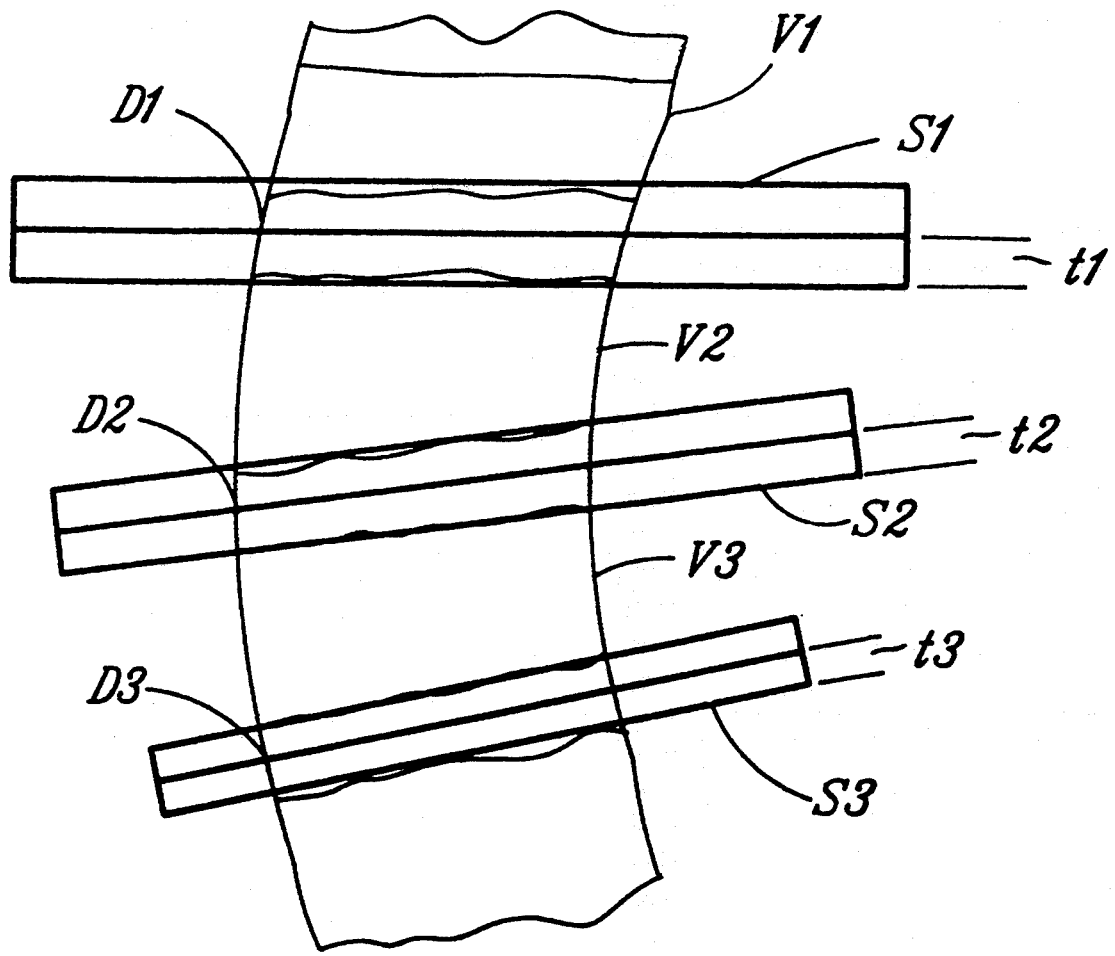
FIGS. 3 and 4 schematics of anatomical structures showing slice regions to be imaged through the use of the method according to the invention.

FIG. 3 is a schematic sagittal plane diagram of a segment of the spinal column which is comprised of vertebra V1, V2, V3 with interposed discs D1, D2, D3. In order to obtain axial and axial to coronal oblique images of the discs by magnetic resonance imaging, slice region markers S1, S2 and S3 are positioned, and the corresponding slice regions are excited to emit NNR signals. The NMR signals are emitted under magnetic field conditions which allow the received signals to be processed and images to be derived therefrom. As shown, slices S1, S2, and S3 have thicknesses $t_1$, $t_2$, and $t_3$ which are different. In other words, the slices differ in thickness resolution.

Figure 4:
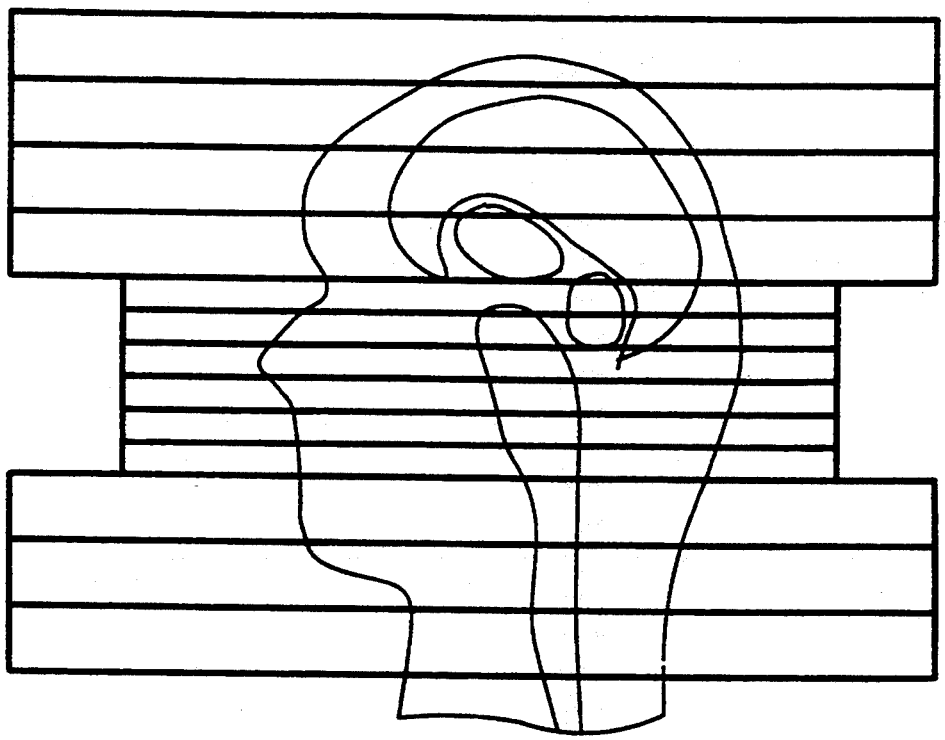

In FIG. 4 a sagittal scout image of the head is used for setting slice position and thickness of a subsequent full head scan. The slice thickness of each slice is set independently of all the other slices. This permits the entire head to be scanned without an undue number of slices, and at the same time thin slices with greater in-slice resolution where required can be obtained. Because the method according to the invention does not require additional pulses, or lengthen the repetition time, it can be carried out on existing MRI scanners. Moreover, it does not require the deletion or lengthening of any part of a scan. Accordingly, the method can be employed without loss of other features such as multi-angle, oblique scanning, and without any reduction in the number of slices which can be scanned within a particular time interval.

It will be understood that changes and modifications of the preferred embodiment described above may be made. For example, imaging techniques other than 2-D FT imaging may employ the method according to the invention. Additionally, the use of non-planar slices is a topic of growing interest in the MRI field, and the method according to the invention may be incorporated into non-planar slice imaging as that technology develops. Moreover, the invention is not limited to medical imaging. Accordingly, the preferred embodiments should be taken as illustrative of the invention, but its scope is defined by the following claims.

We claim:

1. A method of obtaining nuclear magnetic resonance (NMR) data for multiple slice regions within an object with different spatial resolutions during a single scan of the object, comprising:
   defining a plurality of slice regions in an object for which NMR data is to be obtained;
   exciting emission of spatially encoded NNR signals from the slice regions, wherein at least two selected slice regions are excited to emit NMR signals encoded with different spatial resolutions;
   receiving the emitted NMR signals; and
   repeating the excitation of the slice regions without interruption until NMR signals from each slice region sufficient to obtain the desired resolution have been received.

2. A method according to claim 1, wherein the step of exciting emission of NMR signals is carried out with said at least two selected slice regions excited to emit NMR signals encoded with different thickness resolutions.

3. A method according to claim 1, wherein the step of exciting emission of NMR signals is carried out with said at least two selected slice regions excited to emit NNR signals encoded with different in-slice resolution.

4. A method according to claim 1, wherein the step of exciting emission of NMR signals is carried out by applying a slice-select magnetic field gradient to define a first slice region of a first thickness relative to the bandwidth of an RF excitation pulse and by applying a different slice-select magnetic field gradient to define a second slice region of a second thickness relative to the bandwidth of the RF excitation pulse.

5. A method according to claim 1, wherein the step of exciting emission of NMR signals is carried out by applying a first sequence of phase encoding and readout gradient magnetic fields for spatially encoding NMR signals from a first slice region with a first in-slice resolution, and by applying a second sequence of phase encoding and readout gradient magnetic fields for spatially encoding NMR signals from a second slice region with a second in-slice resolution.

6. A method according to claim 1, further comprising:
   decoding the received NMR signals to develop magnetic resonance imaging (MRI) data; and
   forming images of the slice regions of the object from the MRI data.

7. A method according to claim 1, wherein the step of defining a plurality of slice regions is comprised of:
   performing a scan of the object to be imaged;
   displaying a scout image of a section of the object obtained from the scan;
   positioning slice markers on the displayed scout image of the object; and
   selecting a resolution for each slice region marked by a slice marker, wherein at least two marked slice regions have different selected resolutions.

8. A method according to claim 1, wherein at least two of said slice markers are nonparallel.

9. A method of obtaining magnetic resonance imaging data in multiple slices with different resolutions during a single scan of an object, comprising:
   positioning an object to be imaged within a magnetic field;
   establishing a magnetic field gradient within the magnetic field that is effective to define slice regions within the object that each contain nuclei which exhibit a respective distinct NNR frequency corresponding to the slice region;
   irradiating the object with radio frequency energy to resonate nuclei of the object within a selected first slice region;
   establishing magnetic field gradients to spatially encode the NNR signals emitted from the nuclei within the first slice region;
   receiving the NMR signals emitted from nuclei within the first slice region;
   irradiating the object with radio frequency energy to resonate nuclei of the object within a selected second slice region;
   establishing magnetic field gradients to spatially encode the NMR signals emitted from the nuclei within the second slice region;
   setting the magnetic field gradient effective to define slice regions and the magnetic field gradients for spatially encoding the NMR signals emitted from the second slice region with a spatial resolution different from that of the first slice region;
   receiving the NMR signals emitted from the nuclei within the second slice region, and
   repeating the steps of irradiating the object, establishing magnetic field gradients and receiving NMR signals for each slice region to be imaged until data from all of the slice regions to be imaged has been collected.

10. A method for obtaining NRI data according to claim 9, wherein the steps of irradiating the object with radio frequency energy comprise:
    irradiating the object with a sequence of radio frequency pulses in which each successive pulse is effective to excite a successive slice region.

11. A method for obtaining MRI data according to claim 9, wherein the step of setting the magnetic field gradients comprises:
    changing the magnetic field gradient effective to define the slice regions for defining a different thickness resolution for different slices during the course of a scan.

12. A method for obtaining MRI data according to claim 9, wherein the step of setting he magnetic field gradients comprises:
    changing the magnetic field gradients effective for spatially encoding the NMR signals from a slice to set the in-slice resolution of different slices to different values during the course of a scan.

13. A method of obtaining magnetic resonance imaging (MRI) data for multiple planes within an object with different resolutions during a single scan of the object, comprising:
    positioning an object within a magnetic field;

determining first and second selected planes in the object for which MRI data is to be obtained, subjecting the object to a plurality of repetitions of a first repetition sequence composed of nuclear magnetic resonance (NMR) excitation and magnetic field gradient pulses, each of said repetitions of said first repetition sequence including the steps of applying an excitation pulse, applying magnetic gradient fields for spatially encoding the nuclear spins excited by said excitation pulse and reading out of an NMR signal produced by said excitation pulse, said excitation pulse for said first repetition sequence being applied at a predetermined frequency in the presence of a predetermined slice selector magnetic field gradient for defining an excited slice region within said object corresponding to said first selected plane, and said plurality of repetitions of said first repetition sequence being carried out in a manner to encode spatial information into a first collection of NMR signals representative of MRI data for said first selected plane with a first spatial resolution;

subjecting the object to a plurality of repetitions of a second repetition sequence composed of NMR excitation and magnetic field gradient pulses, each of said repetitions of said second repetition sequence including the steps of applying an excitation pulse, applying magnetic gradient fields for spatially encoding the nuclear spins excited by said excitation pulse, and reading out of an NMR signal produced by said excitation pulse, said excitation pulse for said second repetition sequence being applied at a predetermined frequency in the presence of a predetermined slice selector magnetic field gradient for defining an excited slice region within said object corresponding to said second selected plane, and said plurality of repetitions of said second repetition sequence being carried out in a manner to encode spatial information into a second collection of NMR signals representative of MRI data for said second selected plane with a second spatial resolution different from that for said first selected plane; and said plurality of repetitions of said first and second repetition sequences each being carried out during the course of a single scan of said object and each being continued approximately throughout said single scan, the repetition time interval for repeating each of said first and second repetition sequences being substantially the same, and said steps of applying an excitation pulse and reading out of an NMR signal for each repetition of said second repetition sequence being performed at a different time during said repetition time interval than each of said steps of applying an excitation pulse and reading out of an NMR signal for said first repetition sequence.

14. A method according to claim 13, wherein the step of subjecting the object to a plurality of repetitions of said second repetition sequence is carried out to spatially encode the NMR signals from said second selected plane with a thickness different from, the thickness of said first selected plane.

15. A method according to claim 13, wherein the step of subjecting the object to a plurality of repetitions of said second repetition sequence is carried out to spatially encode the NMR signals from said second selected plane with a resolution within the plane different from the resolution within of said first selected plane.

16. A method of displaying the internal structure of an object, comprising:

positioning an object to be imaged in a magnetic field;

establishing controlled gradients within the magnetic field to define slice regions passing through the object at selected positions and orientations;

irradiating the object with electromagnetic fields having a frequency effective for inducing magnetic resonance in the nuclei of the object within the slice regions;

establishing controlled gradients within the magnetic field to spatially encode the electromagnetic radiation emitted by the resonant nuclei within the slice regions;

controlling the gradients within the magnetic field to spatially encode the electromagnetic radiation emitted by the resonant nuclei within the different slice regions with different respective resolutions;

receiving the electromagnetic radiation emitted by the resonant nuclei within, the respective slice regions;

decoding the received NNR signals to develop MRI data of the nuclei which emitted the electromagnetic radiation; and forming images of the respective slice regions from the MRI data.

* * * * *